(12) United States Patent
Martinez

(10) Patent No.: US 10,906,490 B2
(45) Date of Patent: Feb. 2, 2021

(54) COVER ASSEMBLY

(71) Applicant: Nissan North America, Inc., Franklin, TN (US)

(72) Inventor: Hugo Martinez, Toluca (MX)

(73) Assignee: Nissan North America, Inc., Franklin, TN (US)

( * ) Notice: Subject to any disclaimer, the term of this patent is extended or adjusted under 35 U.S.C. 154(b) by 128 days.

(21) Appl. No.: 16/378,242

(22) Filed: Apr. 8, 2019

(65) Prior Publication Data

US 2020/0317151 A1    Oct. 8, 2020

(51) Int. Cl.
| | | |
|---|---|---|
| *B60R 13/00* | (2006.01) | |
| *B60R 21/01* | (2006.01) | |
| *H05K 5/03* | (2006.01) | |
| *H05K 5/00* | (2006.01) | |

(52) U.S. Cl.
CPC ........... *B60R 21/01* (2013.01); *H05K 5/0017* (2013.01); *H05K 5/03* (2013.01); *B60R 2021/01006* (2013.01); *B60R 2021/01286* (2013.01)

(58) Field of Classification Search
CPC .. A01M 1/04; A01M 1/223; A01M 2200/012; A45B 11/00; B60J 7/041; G11C 11/5621; G11C 16/0483; G11C 11/5628; G11C 2211/5642; C04B 14/06
See application file for complete search history.

(56) References Cited

U.S. PATENT DOCUMENTS

| | | | | | |
|---|---|---|---|---|---|
| 5,823,599 | A  * | 10/1998 | Gray | ...................... | B60K 37/00 |
| | | | | | 296/37.8 |
| 6,761,388 | B2 * | 7/2004 | Lein | ....................... | B60N 3/002 |
| | | | | | 296/24.34 |
| 6,942,267 | B1 * | 9/2005 | Sturt | ....................... | B60N 3/102 |
| | | | | | 248/311.2 |
| 7,481,475 | B1 * | 1/2009 | Lim | ........................ | B60R 7/04 |
| | | | | | 296/24.34 |
| 7,866,722 | B2 * | 1/2011 | Shibata | .................... | B60R 7/04 |
| | | | | | 296/24.34 |
| 8,419,101 | B2 * | 4/2013 | Stueber | .................. | B60N 2/793 |
| | | | | | 296/24.34 |

(Continued)

FOREIGN PATENT DOCUMENTS

| | | |
|---|---|---|
| CN | 202679870 U | 1/2013 |
| DE | 10045728 A1 | 3/2001 |
| DE | 102011089786 A1 | 3/2013 |

*Primary Examiner* — Kiran B Patel
(74) *Attorney, Agent, or Firm* — Global IP Counselors, LLP

(57) ABSTRACT

A cover assembly includes a cover and a bracket. The cover conceals and protects the electronic device with lower peripheral portions of the cover at least partially surrounding the electronic device and contacting the floor of a passenger compartment of a vehicle. The bracket is attached to the cover and is installed to the floor of the vehicle adjacent to the electronic device. The bracket further has a central section that extends upward away from the cover. A center console structure is installed to the floor defining a hollow interior. The electronic device, the cover and the bracket are located within the hollow interior of the center console structure and are covered by the center console structure. A portion of the center consoled is connected to the central section of the bracket within the hollow interior.

18 Claims, 4 Drawing Sheets

(56) References Cited

U.S. PATENT DOCUMENTS

| | | | |
|---|---|---|---|
| 8,915,531 B2* | 12/2014 | Horton | B60R 11/00 296/37.8 |
| 8,919,847 B2* | 12/2014 | Mather | B60R 7/04 296/24.34 |
| 8,939,491 B2* | 1/2015 | Gillis | B60N 3/101 296/24.34 |
| 9,016,752 B2* | 4/2015 | Myers | B60R 7/06 296/24.34 |
| 9,106,107 B2* | 8/2015 | Kanasugi | H02J 50/90 |
| 9,333,920 B2* | 5/2016 | Skapof | B60R 7/04 |
| 9,428,092 B2* | 8/2016 | Bosma | B60N 3/103 |
| 9,597,991 B2* | 3/2017 | Amick | B65D 43/16 |
| 9,630,564 B1 | 4/2017 | Cano | |
| 9,776,572 B2* | 10/2017 | Mizobata | B60R 7/04 |
| 9,783,124 B2* | 10/2017 | Catlin | B60R 11/0241 |
| 9,845,055 B2* | 12/2017 | Buza | B60R 7/04 |
| 9,873,382 B1* | 1/2018 | Gerczak | B60R 7/04 |
| 9,981,589 B2* | 5/2018 | Senda | B60N 3/107 |
| 10,404,085 B2* | 9/2019 | An | H02J 7/0045 |
| 10,442,367 B1* | 10/2019 | Gachuz Navarro | B60R 11/0241 |
| 10,493,922 B2* | 12/2019 | Perez | B60R 11/0241 |
| 10,533,351 B2* | 1/2020 | Yano | E05B 85/22 |
| 2002/0112870 A1 | 8/2002 | Kobayashi et al. | |
| 2009/0058120 A1* | 3/2009 | Ioka | B60N 2/79 296/24.34 |
| 2009/0174209 A1* | 7/2009 | Lota | B60R 11/02 296/24.34 |
| 2011/0018297 A1* | 1/2011 | Chheang | B60R 13/0262 296/24.34 |
| 2011/0127791 A1* | 6/2011 | Penner | B60R 7/04 296/24.34 |
| 2013/0057011 A1* | 3/2013 | Yamagishi | B60R 7/04 296/24.34 |
| 2013/0058059 A1 | 3/2013 | Min et al. | |
| 2014/0049063 A1* | 2/2014 | Yamaguchi | B60R 7/04 296/24.34 |
| 2014/0300124 A1* | 10/2014 | Brinas | B60R 7/04 296/24.34 |
| 2015/0130206 A1* | 5/2015 | Schneider | B60R 7/04 296/24.34 |

* cited by examiner

COVER ASSEMBLY

BACKGROUND

Field of the Invention

The present invention generally relates to cover assembly. More specifically, the present invention relates to cover assembly that covers an electronic device with the cover and the electronic device being further covered and concealed by a center console structure.

Background Information

Moisture contacting electrical components within a vehicle has always been a concern. Atmospheric conditions often cause moisture in the air to condense within a vehicle, in particular when an air conditioning system of the vehicle is not operating. Further the actions of a vehicle operator and vehicle passengers and their liquid refreshments also presents a potential moisture problem in the event that electronic devices are located in areas such as within or underneath a center console structure that includes cup holders.

SUMMARY

One object of the present disclosure is to provide a vehicle that includes one or more electronic components within the passenger compartment with a cover that prevents moisture and liquids within the passenger compartment from contacting and potentially damaging such electronic components.

In view of the state of the known technology, one aspect of the present disclosure is to provide a cover assembly for a vehicle with a passenger compartment with an electronic device installed to the floor. The cover assembly further includes a cover, a bracket and a center console structure. The cover conceals and protects the electronic device with lower peripheral portions of the cover at least partially surrounding the electronic device and contacting the floor. The bracket is attached to the cover and is installed to the floor adjacent to the electronic device. The bracket further has a central section that extends upward away from the cover. The center console structure is installed to the floor defining a hollow interior. The electronic device, the cover and the bracket are all located within the hollow interior of the center console structure and are covered by the center console structure. A portion of the center consoled is connected to the central section of the bracket within the hollow interior.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

Figure 1:
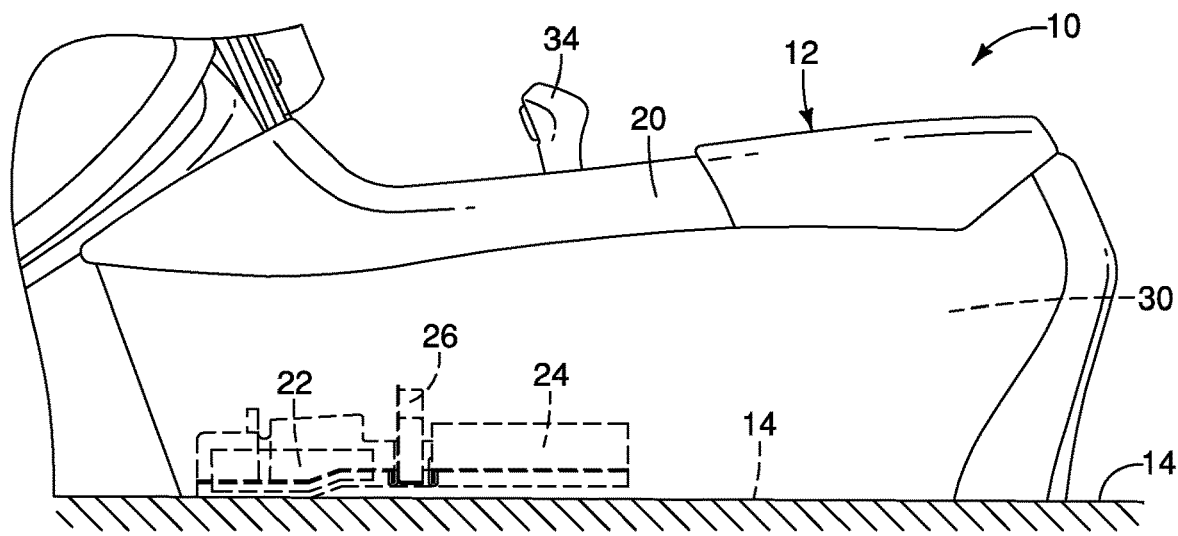
FIG. 1 is a side view of a center console assembly attached to the floor within a passenger compartment of a vehicle showing in phantom a cover and bracket that cover and protect an electronic device in accordance with an exemplary embodiment.
Figure 2:
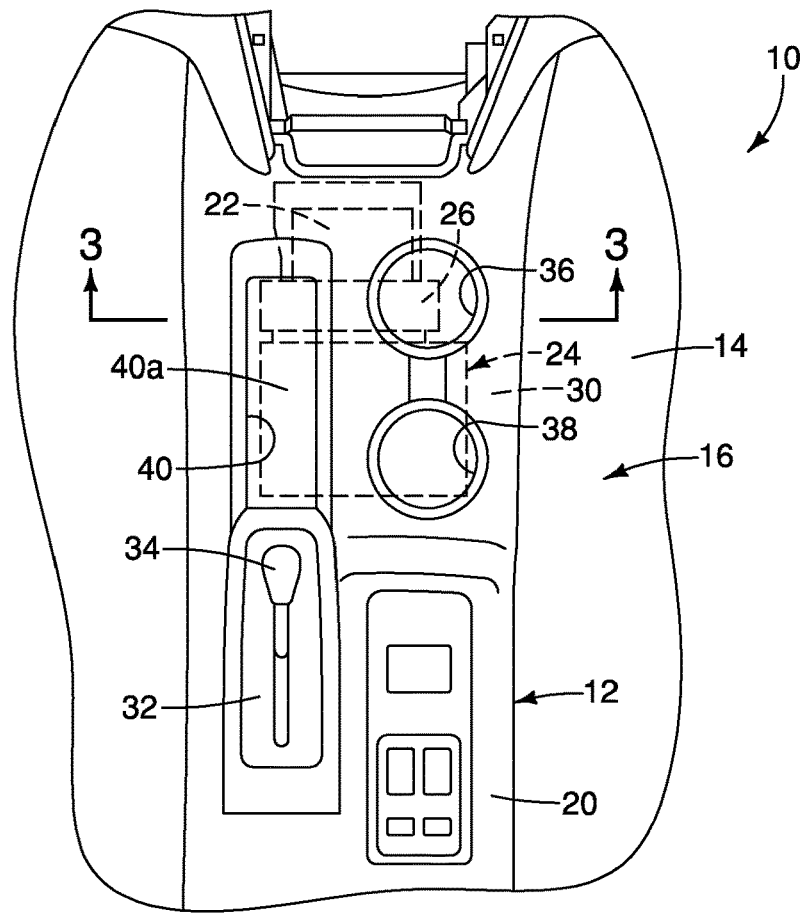
FIG. 2 is a top view of the center console assembly showing in phantom the cover, the bracket and the electronic device in accordance with an exemplary embodiment.

Referring initially to FIGS. 1 and 2, a vehicle 10 with a cover assembly 12 installed to a floor 14 of a passenger compartment 16 within the vehicle 10, is illustrated in accordance with a first embodiment. Since vehicle body structures of vehicle that define passenger compartments of vehicles are conventional structures, further description of passenger compartments is omitted for the sake of brevity.

The floor 14 within the passenger compartment 16 can include a number of uneven surface portions, or can be completely level, depending upon the overall design of the vehicle 10 and the features installed within the passenger compartment 16. In the depicted embodiment, the floor 14 includes several dimples or uneven surface areas, as is shown in, for example, FIGS. 1 and 7. However, it should be understood that the floor 14 can have any of a variety of surface contours.

As shown in FIGS. 1 and 2, the cover assembly 12 includes a center console structure 20 that covers and conceals an electronic device 22 (in phantom lines), a cover 24 (in phantom lines) and an attachment bracket 26 (in phantom lines, and, hereinafter referred to as the bracket 26).

The center console structure 20 installed to the floor 14 via, for example, mechanical fasteners in a conventional manner. Since structures, such as mechanical fasteners, used to attach center console structures to the floor of a passenger compartment are conventional features, further description will be omitted for the sake of brevity.

The center console structure 20 and the floor 14 of the passenger compartment 16 define a hollow interior 30 therebetween. The electronic device 22, the cover 24 and the bracket 26 are all located within the hollow interior 30 of the center console structure 20 and are covered by the center console structure 20. A portion of the center console structure 20 is connected to a central section 26*a* of the bracket 26 within the hollow interior 30, as is described in greater detail below.

The center console structure 20 includes a variety of features, some required, some optional. For example, the center console structure 20 includes an area 32 that receives a transmission shifter lever 34. Since transmission shifter levers are conventional automotive components, further description is omitted for the sake of brevity. The center console structure 20 also includes at least one cupholder or two cupholders such as the cupholders 36 and 38. The cupholders 36 and 38 have respective bottom walls 36a and 38a. The center console structure 20 can further include a storage tray area 40 having a bottom wall 40a, as shown in FIGS. 2 and 3.

The electronic device 22 is fixed to the floor 14 via, for example, mechanical fasteners (not shown) and is subsequently covered by the center console structure 20, thereby being located within the hollow interior 30. The electronic device 22 can be any of a variety of electronic devices used to control a component or components within the vehicle 10. In the depicted embodiment, the electronic device 22 is an electronic controller that controls operation of airbags within the vehicle 10. Since such electronic controllers and airbags are conventional vehicle components, further description is omitted for the sake of brevity.

It should be understood that the electronic device 22 can be any of a variety of electronic devices or electronic controllers within the vehicle 10, such as, for example, an electronic body controller (BCM) or part of an electronic control module (ECM) that controls features on the engine (not shown) of the vehicle 10.

Figure 3:
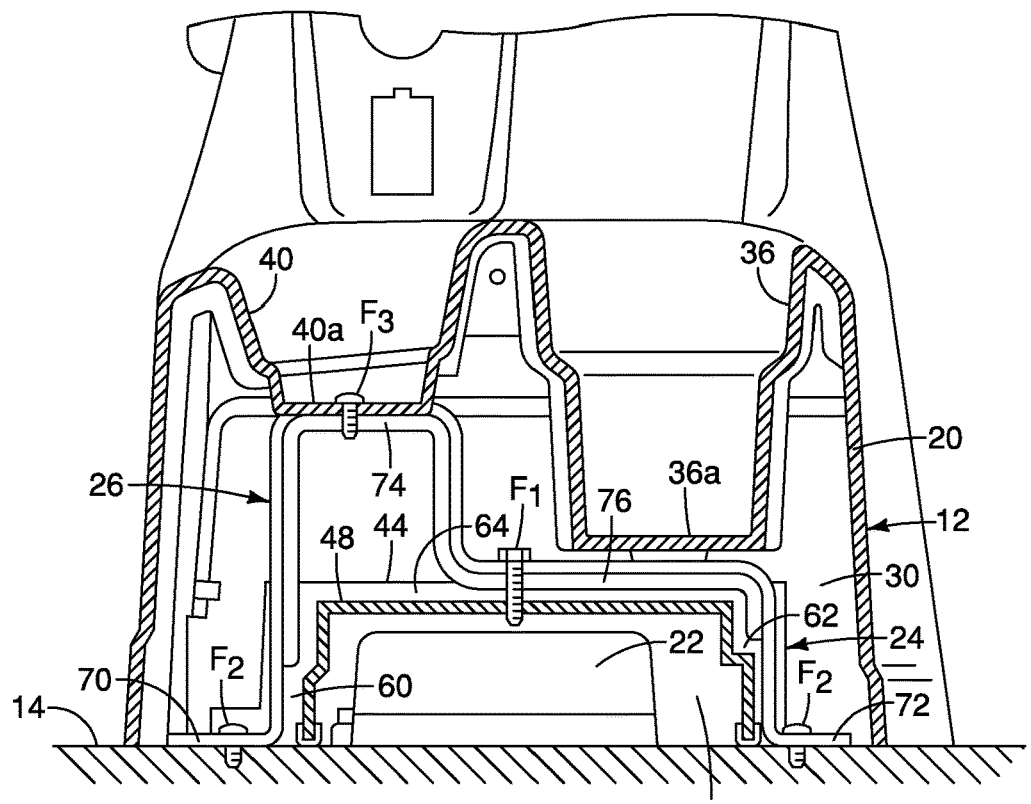
FIG. 3 is a cross-sectional view of the center console assembly taken along the line 3-3 in FIG. 2 showing details of the electronic device, the cover and the bracket in accordance with an exemplary embodiment.

As shown in FIGS. 1-3, the cover 24 is located within the hollow interior 30 of the center console structure 10. Further, the electronic device 22 is located between the cover 24 and the floor 14 in a space 25 (FIG. 3) defined therebetween. The cover 24 conceals and protects the electronic device 22. As shown in FIGS. 3-8, the cover 24 includes lower peripheral portions 42, a forward section 44, a rearward section 46 and a recessed section 48 located between the forward section 44 and the rearward section 46.

Figure 5:
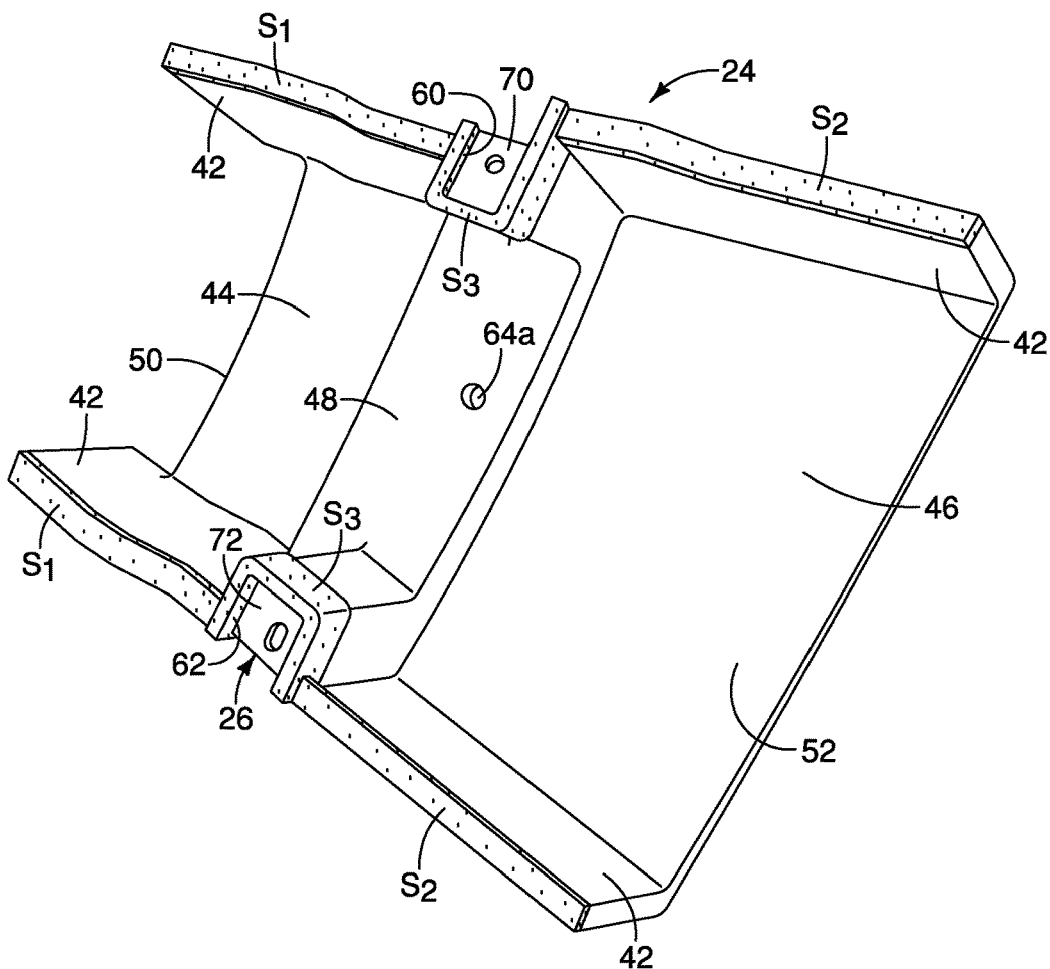
FIG. 5 is another perspective view of underside surfaces and a lower peripheral edges of the cover with ends of the bracket in accordance with an exemplary embodiment.

FIG. 5 depicts an underside of the cover 24. As shown in FIG. 5, the lower peripheral portion 42 can completely encircle a bottom edge of the cover 24. However, in the depicted embodiment, the lower peripheral portion 42 is not continuous. The forward section 44 has an open forward end 50 and the rearward section 46 has an open rear end 52, as shown in FIG. 5. As is also shown in FIG. 5, the lower peripheral portions 42 along the forward section 44 are provided with seals $S_1$. The lower peripheral portions 42 along the rearward section 46 are provided with seals $S_2$. The lower peripheral portions 42 along the recessed section 48 are provided with seals $S_3$.

Figure 4:
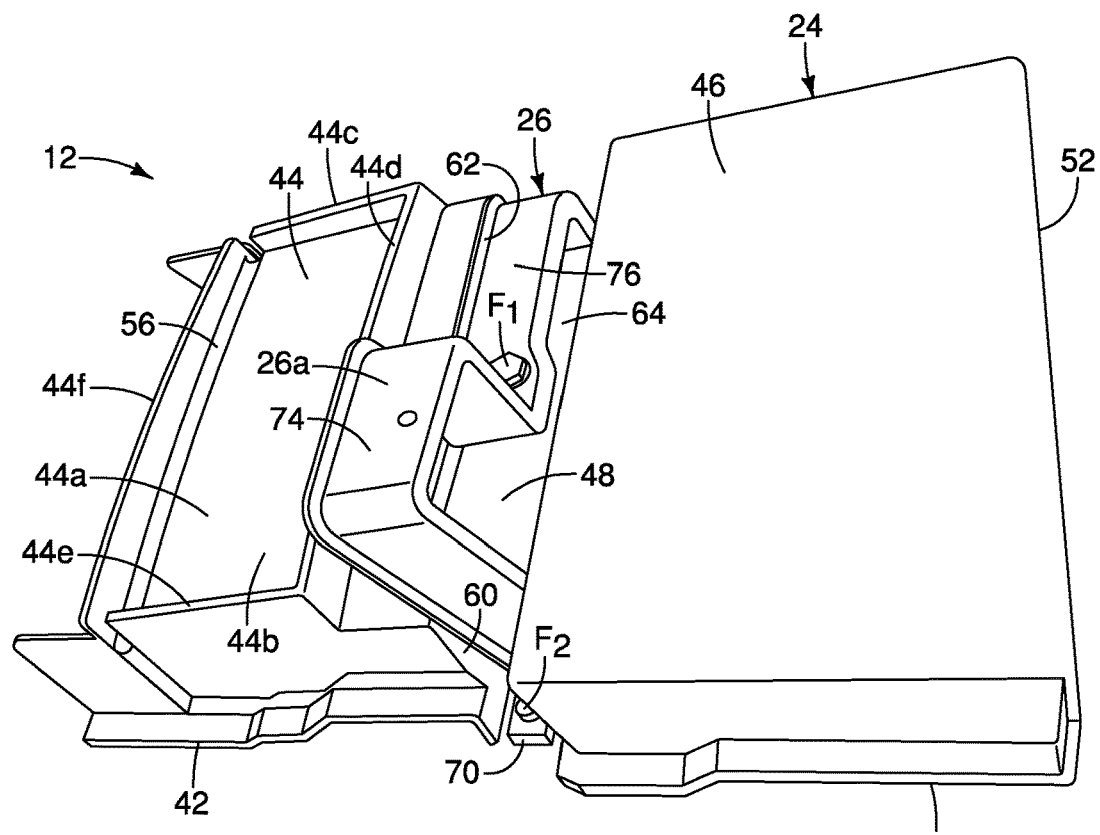
FIG. 4 is a perspective view of upper surfaces of the cover and the bracket shown removed from the passenger compartment in accordance with an exemplary embodiment.
Figure 6:
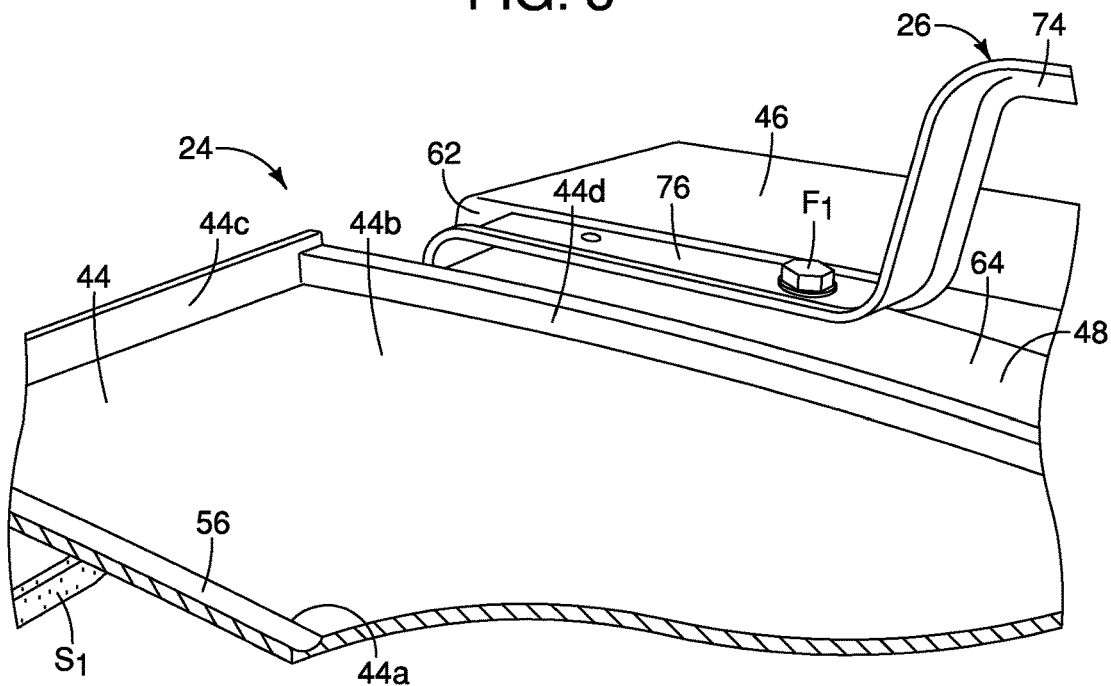
FIG. 6 is perspective view of portions of upper surfaces of the cover and the bracket showing a water diverting channel in accordance with an exemplary embodiment.
Figure 7:
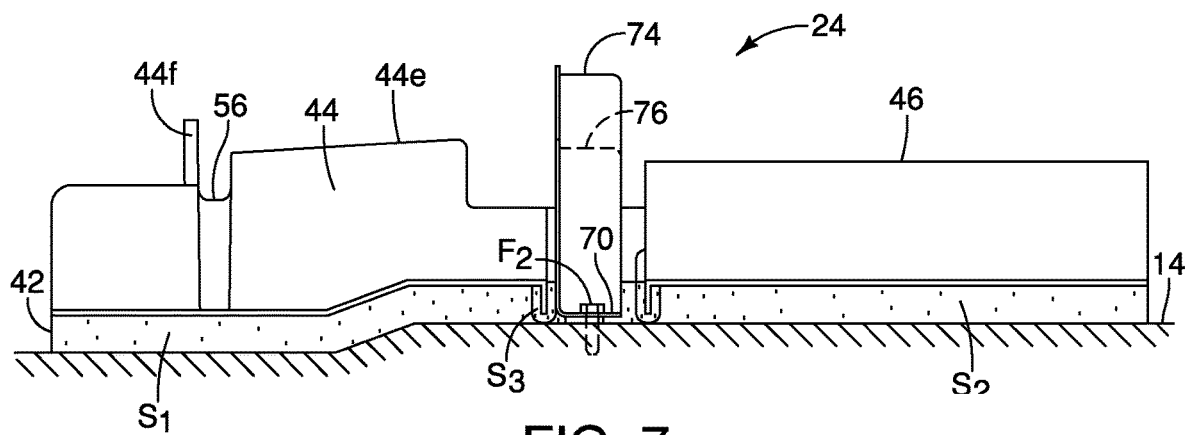
FIG. 7 is a side view of the cover and the bracket installed to the floor showing the water diverting channel in accordance with an exemplary embodiment.
Figure 8:
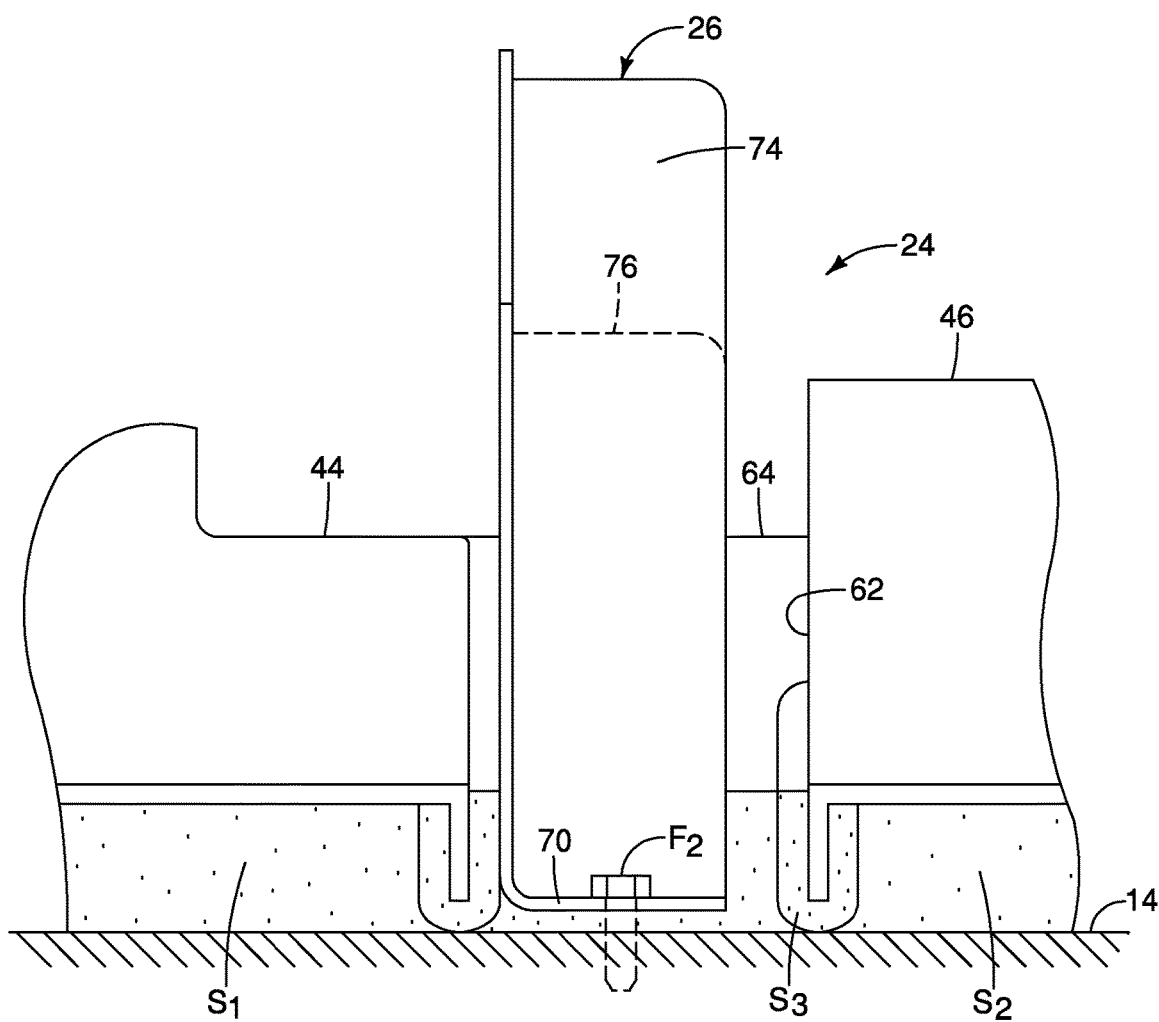
FIG. 8 is another side view of a portion of the cover and bracket depicted in FIG. 8 showing seals attached to the lower peripheral edges of the cover compressed against the surface of the floor establishing a water tight seal therebetween in accordance with an exemplary embodiment.

As shown in FIGS. 4, 6 and 7 the forward section 44 includes a water diverting recess or channel 56. The forward section 44 is not level. Specifically, a forward end 44a of the forward section 44 is slightly lower than a rear end 44b of the forward section. The forward section 44 further includes upwardly projecting walls 44c, 44d, 44e and 44f. Further, the channel 56 has a slight inclination relative to the forward section 44 of the cover 24. Consequently, when the cover 24 is installed to the floor 14 and the vehicle 10 is on level ground, the channel 56 is inclined such that any moisture or liquid that drains or condenses on to the upper surface of the forward section 44 is directed to the channel 56 and drains in a direction away from the electronic device 22. The forward section 44 is positioned under the cupholder 36. Any moisture or condensation that may form or be spilled into the cupholder 36 will at least partially drain into the forward section 44 and be directed by the upwardly projecting walls 44c, 44d, 44e and 44f toward the channel 56.

The recessed section 48 is located between the forward section 44 and the rearward section 46. The recessed section 48 is a basically bracket receiving recess that is dimensioned to receive portions of the bracket 26, as described below. As shown in FIGS. 3 and 5, the recessed section 48 (the basically bracket receiving recess) includes a first area 60, a second area 62 and a third area 64. The first area 60 is located at a first lateral side of the recessed section 48, the second area is located at a second lateral side of the recessed section 48 and the third area 64 is located along an upper surface of the cover 24. The third area 64 includes a first aperture 64a (FIG. 5).

The attachment bracket 26 includes a first end 70, a second end 72, a first central section 74 and a second central section 76. The first end 70 is a flange that extends approximately parallel to the floor 14. The first end 70, as shown in FIGS. 3, 4 and 5, is located within the first area 60 of the recessed section 48. Similarly, the second end 72 is a flange that extends approximately parallel to the floor 14. As is also shown in FIGS. 3, 4 and 5, the second end 72 is located within the second area 62 of the recessed section 48. In other words, the first end 70 is located at a first lateral side of the recessed section 48 (and the cover 24), and, the second end 72 is located at a second lateral side of the recessed section 48 (and the cover 24) opposite the first lateral side of the recessed section 48.

The first central section 74 extends upward from the first end 70 and has an overall U-shape such that an upper end of the first central section 74 is generally horizontally oriented, and, is located above the upper surface of the third area 64 of the recessed section 48 and spaced apart therefrom. The second central section 76 extends generally horizontally from the first central section 74 along the upper surface of the third area 64 of the recessed section 48. However, the second central section 76 overlays and contacts the upper surface of the third area 64 of the recessed section 48.

The second central section 76 includes a second aperture that aligns with the first aperture 65a in the third area 64 of the recessed section 48. A first fastener $F_1$ attaches and fixes the second central section 76 of the bracket 26 to the cover 24, as shown in FIGS. 3, 4 and 6. A pair of second fasteners $F_2$ extend through apertures in respective ones of the first end 70 and the second end 72, and thereafter through threaded openings in the floor 14, thereby attaching and fixing the bracket 26 and the cover 24 to the floor 14. Subsequently, when the center console structure 20 is fixed to the floor 14 by mechanical fasteners (not shown), the center console structure 20 is further attached to the bracket 26 via a third fastener $F_3$ that extends through an aperture in the storage tray 40 and into a threaded opening in the first central section 74, as shown in FIG. 3.

When the second fasteners $F_2$ are installed to the first and second ends 70 and 72 of the bracket 26, the cover 24 is urged toward the floor 14 such that the seals $S_1$, $S_2$ and $S_3$ are slightly compressed providing a water tight seal between the lower peripheral portion 42 of the cover 24 and the floor 14. Thus, moisture from condensation above and outside of the cover 24, or spillage on or adjacent to the cover 24 and the center console structure 20 is kept away from the electronic device 22. The open forward end 50 and the open rear end 52 of the cover 24 allow for the space 25 between the floor 14 and the cover 24 to vent (receive air) such that the electronic device 22 can dissipate heat and allow moisture to evaporate from the space 25.

As shown in FIGS. 3-4 and 6-8, the first end 70, the second end 72 and the second central section 76 of the bracket 26 are all basically located within the recessed section 48 of the cover 24. The first recessed section 74 of the bracket 26 extends upward and above the cover 24 to a height sufficient to fasten to the center console structure 20.

It should be understood from the drawings and the description herein that the features and shapes of the cover 24 and the bracket 26 depicted herein is one example or embodiment of the cover assembly 12. Specifically, the cover 24 can have any of a variety of shapes and surface contours other than that shown in the drawings depending upon, for example, the size and shape of the electric device 22, and/or, size, shape and overall design of the center console structure 20. For example, the open forward end 50 and the open rear end 52 of the cover 24 can be replaced with wall sections such that the cover 24 completely covers and surrounds the electronic device 22 thereby providing a complete moisture barrier, but, preventing any venting to the electronic device 22.

Similarly, the bracket 26 can have any of a variety of shapes and surface contours other than that shown in the drawings depending upon, for example, the size and shape of the cover 24, and, size, shape and overall design of the center console structure 20. In the depicted embodiment, the bracket 26 includes the first central section 74 and the second central section 76 that are shaped and configured to conform to the shape of the storage tray 40 and the cupholders 36 and 38 such that the first central section 74 is attached to the first central section 74 of the bracket 26. It should be understood from the drawings and the description herein that the center console structure 20 can alternatively be designed without a storage tray, and/or, without cupholders. Still further, the center console structure 20 can be reconfigured to change the location and/or size of storage areas and/or cupholders 36 and 38 such that storage areas and cupholders differ from the design of the center console structure 20 shown and described herein. Consequently, the bracket 26 can be modified to accommodate the alternative designs of the center console structure 20. For example, the first central section 74 and the second central section 76 can be replaced with a single central section that has a uniform height above the upper surface of the cover 24. Still further, the attachment between the bracket 26 and the center console structure can be accomplished without a fastener opening being formed in the bottom wall 40a of the storage tray 40. Alternatively, a snap-fitting fastener can be installed to a lower surface of the bottom wall 40a of the storage tray 40 and pressed into the opening in the first central section 74 of the bracket 26. Still further, a protrusion (not shown) can be provided on an interior surface of the center console structure 20 within the hollow interior 30 that slides into a slot (not shown) defined on one or both of the first and second central sections 74 and 76 of the bracket 26.

The various elements of the center console structure, the passenger compartment and the vehicle, other than those described above, are conventional components that are well known in the art. Since such structures and features are well known in the art, these structures will not be discussed or illustrated in detail herein. Rather, it will be apparent to those skilled in the art from this disclosure that the components can be any type of structure and/or programming that can be used to carry out the present invention.

GENERAL INTERPRETATION OF TERMS

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment, the following directional terms "forward", "rearward", "above", "downward", "vertical", "horizontal", "below" and "transverse" as well as any other similar directional terms refer to those directions of a vehicle equipped with the cover assembly. Accordingly, these terms, as utilized to describe the present invention should be interpreted relative to a vehicle equipped with the cover assembly.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such features. Thus, the foregoing descriptions of the embodiments according to the present invention are provided for illustration only, and not for the purpose of limiting the invention as defined by the appended claims and their equivalents.

What is claimed is:

1. A cover assembly comprising:
   a vehicle having a passenger compartment with a floor;
   an electronic device installed to the floor;
   a cover concealing and protecting the electronic device with lower peripheral portions of the cover at least partially surrounding the electronic device and contacting the floor;
   a bracket attached to the cover and installed to the floor adjacent to the electronic device, the bracket further having a central section that extends upward away from the cover; and
   a center console structure installed to the floor defining a hollow interior, the electronic device, the cover and the bracket being located within the hollow interior of the center console structure and being covered by the center console structure, a portion of the center consoled being connected to the central section of the bracket within the hollow interior.

2. The cover assembly according to claim 1, wherein the lower peripheral portions include a sealing member that prevents liquid from entering a space defined between the floor and the cover, the electronic device being located within the space.

3. The cover assembly according to claim 1, wherein the cover includes a bracket receiving recess with at least a portion of the bracket being disposed within the bracket receiving recess.

4. The cover assembly according to claim 3, wherein
the bracket receiving recess of the cover includes a first aperture, and
the portion of the bracket disposed within the bracket receiving recess includes a second aperture with a fastener extending through the second opening into the first opening attaching the bracket to the cover.

5. The cover assembly according to claim 4, wherein
the central section of the bracket includes the portion of the bracket disposed within the bracket receiving recess.

6. The cover assembly according to claim 1, wherein
the surface of the center console structure connected to the central section of the bracket defines a bottom wall of a storage tray of the center console structure.

7. The cover assembly according to claim 1, wherein
the bracket includes a first end and a second end spaced apart from one another with the central section of the bracket being defined between the first end and the second end.

8. The cover assembly according to claim 7, wherein
the first end of the bracket attaches to the floor adjacent to a first lateral side of the cover and the second end of the bracket attaches to the floor adjacent to a second lateral side of the cover, the first lateral side of the cover being at an opposite side of the cover from the second lateral side of the cover.

9. The cover assembly according to claim 7, wherein
the bracket includes a first end and a second end spaced apart from one another with the central section of the bracket being defined between the first end and the second end.

10. The cover assembly according to claim 9, wherein
the cover includes a bracket receiving recess that extends along the first lateral side of cover, a top surface of the cover and the second lateral side of the cover.

11. The cover assembly according to claim 10, wherein
the first end of the bracket is at least partially disposed within the recess at the first lateral side of the cover and the second end of the bracket is at least partially disposed within the recess at the second lateral side of the cover.

12. The cover assembly according to claim 1, wherein
the electronic device is an electronic airbag controller.

13. The cover assembly according to claim 1, wherein
the bracket has an overall inverted U-shape when viewed from a rear side thereof.

14. The cover assembly according to claim 1, wherein
the cover includes a channel along an upper surface thereof dimensioned and shaped to divert liquid to one side of the cover away from the electronic device.

15. The cover assembly according to claim 14, wherein
the cover includes a bracket receiving recess with at least a portion of the bracket being disposed within the bracket receiving recess.

16. The cover assembly according to claim 15, wherein
the bracket receiving recess of the cover includes a first aperture, and
the portion of the bracket disposed within the bracket receiving recess includes a second aperture with a fastener extending through the second opening into the first opening attaching the bracket to the cover.

17. The cover assembly according to claim 16, wherein
the central section of the bracket includes the portion of the bracket disposed within the bracket receiving recess.

18. The cover assembly according to claim 14, wherein
the bracket has a first end and a second end with the first end being at least partially disposed within the bracket receiving recess at a first lateral side of the cover and the second end of the bracket being at least partially disposed within the bracket receiving recess at a second lateral side of the cover.

\* \* \* \* \*